(12) United States Patent
Kobayashi

(10) Patent No.: US 7,855,738 B2
(45) Date of Patent: Dec. 21, 2010

(54) IMAGING DEVICE AND IMAGING METHOD FOR USE IN SUCH DEVICE

(75) Inventor: Isao Kobayashi, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 373 days.

(21) Appl. No.: 11/869,579

(22) Filed: Oct. 9, 2007

(65) Prior Publication Data

US 2008/0036881 A1 Feb. 14, 2008

Related U.S. Application Data

(62) Division of application No. 10/403,286, filed on Apr. 1, 2003, now Pat. No. 7,317,559.

(30) Foreign Application Priority Data

Apr. 5, 2002 (JP) .............................. 2002/103954

(51) Int. Cl.
H04N 5/217 (2006.01)
H04N 5/00 (2006.01)
H04N 1/38 (2006.01)

(52) U.S. Cl. .................... 348/241; 348/607; 358/463

(58) Field of Classification Search ................ 348/241, 348/222.1, 294–324, 607; 358/463
See application file for complete search history.

(56) References Cited

U.S. PATENT DOCUMENTS

| | | | |
|---|---|---|---|
| 5,671,300 A | 9/1997 | Adachi | 382/312 |
| 5,724,456 A | 3/1998 | Boyack et al. | 382/274 |
| 5,880,859 A | 3/1999 | Hiromatsu | 358/514 |
| 5,907,643 A | 5/1999 | Adachi | 382/312 |
| 6,160,260 A * | 12/2000 | Yamayoshi et al. | 250/370.09 |
| 6,166,768 A * | 12/2000 | Fossum et al. | 348/308 |
| 6,351,555 B1 | 2/2002 | Acharya et al. | 382/162 |
| 6,404,853 B1 | 6/2002 | Odogba et al. | 378/98.8 |
| 6,429,898 B1 | 8/2002 | Shoda et al. | 348/316 |
| 6,453,008 B1 | 9/2002 | Sakaguchi et al. | 378/98.7 |
| 6,600,833 B1 | 7/2003 | Tan et al. | 382/167 |
| 6,646,681 B1 * | 11/2003 | Macy et al. | 348/241 |
| 6,677,992 B1 | 1/2004 | Matsumoto et al. | 348/229.1 |
| 6,813,389 B1 | 11/2004 | Gindele et al. | 382/274 |
| 2002/0114506 A1 | 8/2002 | Hiroi et al. | 382/149 |

FOREIGN PATENT DOCUMENTS

| | | |
|---|---|---|
| EP | 0 632 648 A1 | 1/1995 |
| JP | 7-75633 | 3/1995 |
| JP | 2001-99944 | 4/2001 |

* cited by examiner

*Primary Examiner*—David L Ometz
*Assistant Examiner*—Richard Bemben
(74) *Attorney, Agent, or Firm*—Fitzpatrick, Cella, Harper & Scinto

(57) ABSTRACT

An imaging device which assures high-quality image information free from a line noise by extracting line noise information from a taken image, detecting an existence of an extrinsic line noise in the image, and correcting the line noise if it exists. The imaging device comprises a memory circuit for storing image pick-up outputs at imaging of a two-dimensional area sensor comprising photosensors or radiation sensors, an extrinsic line noise detection unit for detecting an extrinsic line noise in the image pick-up outputs stored in the memory circuit, and an arithmetic processing circuit for calculating an output quantity of the detected extrinsic line noise. The line noise is eliminated by correcting the image pick-up outputs on the basis of the obtained output quantity of the extrinsic line noise.

7 Claims, 12 Drawing Sheets

IMAGING DEVICE AND IMAGING METHOD FOR USE IN SUCH DEVICE

This application is a division of application Ser. No. 10/403,286 filed April 2003, which is incorporated herein by reference.

BACKGROUND OF THE INVENTION

1. Field of the Invention

The present invention relates to a facsimile, a digital process copying machine, a still camera, a radiation imaging device, or other two-dimensional imaging devices and its imaging method, and particularly to an imaging device for forming an image by means of visible light or radiation and its imaging method.

2. Related Background Art

Conventionally, there have been put to practical use various types of imaging devices using a large-sized sensor made of two-dimensionally arranged image pick-up devices each having an Si single crystal sensor typified by a CCD sensor or an MOS sensor or each having a PIN sensor of hydrogenated amorphous silicon (hereinafter, referred to as a-Si). These imaging devices are used in not only forming an image of visible light, but also converting a radiation image to an electrical signal with the development of nuclear energy, radiation medical equipment, and nondestructive testing technique.

The S/N ratio in these types of equipment, however, is mostly double- or triple-digit and there has been no demand for any higher-digit S/N ratio. It is because the equipment is inconveniently subject to a memory limitation or a restriction in communication since there is no A/D converter suitable for digitizing an output of a high S/N ratio at a high precision or since a large amount of data remains after conversion, which results in a small demand for an imaging device having a high S/N ratio.

On the other hand, in recent years, development of a bulk memory or high-speed communication is remarkable and this enhances a demand for an imaging device having a higher 4- or 5-digit S/N ratio. Particularly, however, in an imaging device having a sample hold circuit in units of a line, a line noise extemporaneously comes to be mixed in a taken image due to an external environment in some cases. A source of the extrinsic noise, particularly in an X-ray imaging device, is an X-ray high-voltage power supply in a neighboring photo studio. It is unclear when and what timing the extemporaneous noise occurs and therefore the picture may be distorted by accident problematically. This problem has occurred also in a device having a reference potential provided for each column or row in a read circuit. In this manner, there has been a need for previously considering how to take measures against the extemporaneous noises as well as a device-specific noise caused by a variance of elements in a sensor panel or the like.

In view of these conventional problems, the present invention has been provided. Therefore it is an object of the present invention to provide an imaging device capable of obtaining high-quality image information with line noises reduced and its imaging method.

SUMMARY OF THE INVENTION

In accordance with a first aspect of the present invention, there is provided an imaging device having a plurality of photosensors or radiation sensors arranged two-dimensionally and generating electric charges according to an amount of incident radiation and a sample hold circuit for outputting the electric charges generated by the photosensors or radiation sensors via a plurality of signal lines in parallel, sampling and holding them, and reading them sequentially, comprising means for storing image pick-up outputs of the photosensors or radiation sensors, means for detecting a line noise in the image pick-up outputs stored in the storing means, means for calculating an output quantity of the detected line noise, and means for correcting the image pick-up output of a line in which the line noise was detected on the basis of the obtained output quantity of the line noise.

In the device, preferably the line noise is extrinsic.

In the device, preferably the line noise detecting means calculates a sum of image pick-up outputs at each line stored in the storing means and compares the sums of the outputs at respective lines with each other to detect a presence or absence of a line noise.

In the device, preferably, assuming that the line where the line noise was detected is X row, the calculating means calculates an average of the sums of the image pick-up outputs at lines on both sides of the X row, calculates a corrected value of the X row by dividing a sum of the obtained averages by the number of columns, and calculates an output quantity of line noise at the X row by subtracting the corrected value at the X row from a value obtained by dividing the sum of the image pick-up outputs at the X row by the number of columns.

In the device, preferably the correcting means corrects the image pick-up outputs by subtracting the output quantity of the line noise from each image pick-up output of the line where the line noise was detected.

In accordance with a second aspect of the present invention, there is provided an imaging system, comprising imaging means including a plurality of photosensors or radiation sensors arranged two-dimensionally and generating electric charges according to an amount of incident radiation and a sample hold circuit for sampling and holding the electric charges generated by the sensors to read them, emitting means for emitting light or radiation, image pick-up output storing means for storing image pick-up outputs at imaging, means for detecting an extrinsic line noise in the image pick-up outputs at imaging, means for calculating an output quantity of the detected extrinsic line noise, arithmetic processing circuit for correcting the image pick-up outputs stored in the image pick-up output storing means on the basis of the obtained output quantity of the extrinsic line noise, and control means for controlling each of the means.

In the system, preferably the emitting means comprises a radiation source and a phosphor so that an object can be put between the radiation source and the phosphor.

In accordance with a third aspect of the present invention, there is provided an imaging method for use in an imaging device having imaging means including a plurality of photosensors or radiation sensors arranged two-dimensionally and generating electric charges according to an amount of incident radiation and a sample hold circuit for sampling and holding the electric charges generated by the sensors to read them and image pick-up output storing means for storing image pick-up outputs of the photosensors or the radiation sensors at imaging, comprising the steps of storing the image pick-up outputs into the image pick-up output storing means, detecting an existence of a line noise in the image pick-up outputs stored in the storing means, calculating an output quantity if the line noise exists, and eliminating the line noise at the line including the line noise in the imaging means by processing the output quantity and the image pick-up outputs stored in the image pick-up output storing means by using an arithmetic processing circuit.

DESCRIPTION OF THE PREFERRED EMBODIMENTS

The preferred embodiments of the present invention will now be described in detail hereinafter with reference to the accompanying drawings.

First Embodiment

Figure 1:
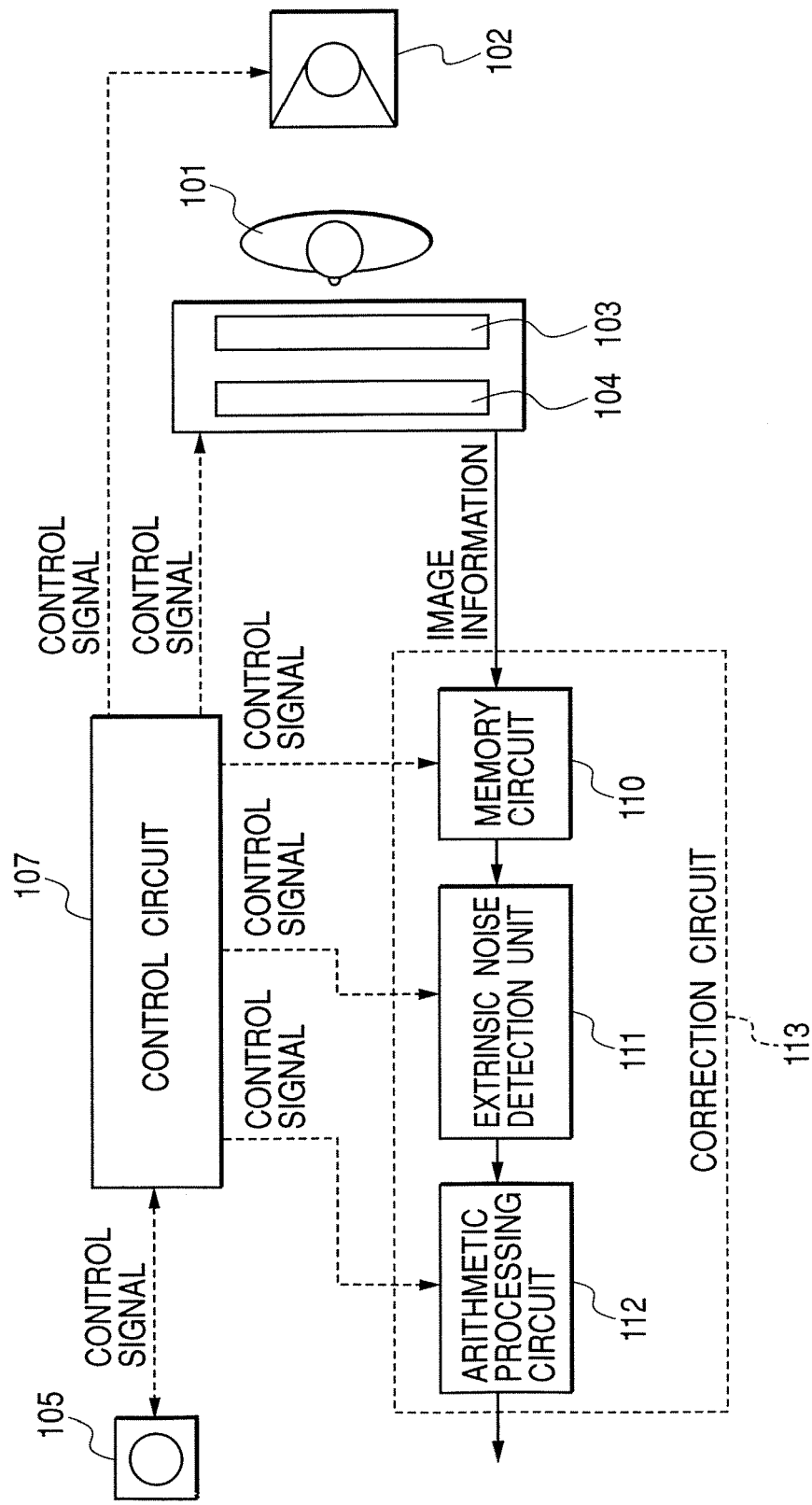
FIG. 1 is a general system block diagram showing a first embodiment of an imaging device according to the present invention.

Referring to FIG. 1, there is shown a system block diagram illustrating a general configuration of a first embodiment of an imaging device according to the present invention. In the first embodiment, the imaging device is described by giving an example of a radiation imaging device for medical X-ray diagnosis.

In FIG. 1, there is shown an X-ray source 102, whose X-ray pulse switching between ON and OFF is controlled by an image pick-up switch 105 and a control circuit 107 controls a tube voltage and a tube current of a tube in the X-ray source 102. An object 101 that is a patient to have a checkup transmits an X-ray emitted from the X-ray source and the X-ray is incident on a phosphor 103 formed by CsI, $Gd_2O_2$, and the like which converts the X-ray to visible light. At this moment, an amount of transmission of the X-ray transmitted by the object 101 depends upon the size or shape of a bone or those of an internal organ inside the object 101 or upon presence or absence of a focus, and the X-ray contains the image information. While the X-ray is used as radiation here, $\alpha$-ray, $\gamma$-ray, or the like is applicable. It is the same with the following embodiments.

The X-ray transmitted by the patient and containing the information is converted to visible light by the phosphor 103 and then incident on a two-dimensional area sensor 104. The two-dimensional area sensor 104, which comprises a plurality of sensors arranged two-dimensionally and a drive circuit for driving them, converts image information light to an electrical signal including two-dimensional information of the object. The two-dimensional area sensor 104 is controlled in its storage time and driving speed by the control circuit 107. An output of the two-dimensional area sensor 104 is stored in a memory circuit 110. While the phosphor is separated from the two-dimensional area sensor in the illustration, preferably they are contacted with each other.

Subsequently, a line noise detection unit 111 detects an existence of a line noise in image pick-up outputs of the two-dimensional area sensor 104 stored in the memory circuit 110. Note that the memory circuit 110, the line noise detection unit 111, and an arithmetic processing circuit 112 form a correction circuit 113 as indicated by a dashed line enclosing them, each of which is controlled by the control circuit 107. As described above, a line noise is often an extrinsic noise during a read operation, and it is often caused by a high-voltage power supply of a radiation source particularly in a medical radiation imaging device.

The two-dimensional area sensor 104 is provided with a read circuit including a sample hold circuit for sampling and holding sensor outputs to read them. The two-dimensional area sensor 104 comprises a plurality of sensors with n rows and m columns and the sample hold circuit is arranged in the row direction, where each sensor output is sampled and held to be read out. In other words, to read out signals of the two-dimensional area sensor 104, signal charges are transferred from a plurality of signal lines in parallel and sensor outputs of each line in the row direction are sequentially read by the sample hold circuit and sequentially stored in the memory circuit 110, by which all line image pick-up outputs are stored in the memory circuit 110. Therefore, if an extrinsic noise occurs while charges are stored in a sample-hold capacitor, all of the stored signal charges are affected, thereby causing a line noise.

If the line noise detection unit 111 detects an existence of the line noise in image pick-up outputs of the two-dimensional area sensor 104 stored in the memory circuit 110, the arithmetic processing circuit 112 calculates a quantity of the line noise. Subsequently the quantity of line noise calculated by the arithmetic processing circuit 112 is subtracted from only the image pick-up outputs of the line including the line noise of the image pick-up outputs from the two-dimensional area sensor 104 stored in the memory circuit 110, by which it becomes possible to obtain image pick-up outputs from which the line noise was subtracted in the image pick-up outputs of the two-dimensional area sensor 104. In other words, a preferable image is achieved also in a photo studio having a high-voltage source for use in a radiation source.

Figure 2:
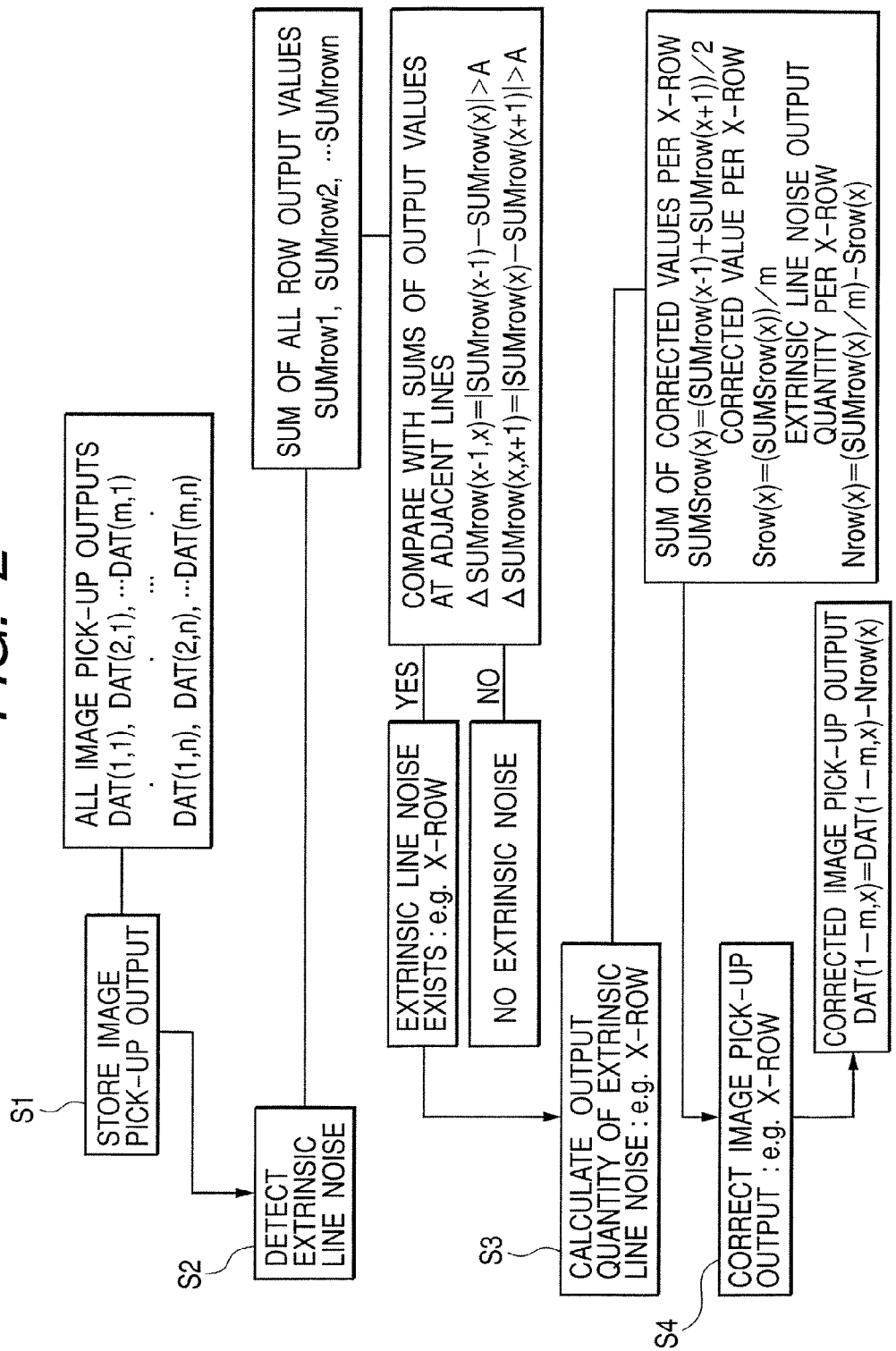
FIG. 2 is a flowchart of assistance in explaining the operation of a correction circuit according to the first embodiment.

Referring to FIG. 2, there is shown a flowchart of a correcting operation of the correction circuit 113. First, as described with referring to FIG. 1, image pick-up outputs of the two-dimensional area sensor 104 are stored in the memory circuit 110 (S1). Assuming that the number of sensors in the two-dimensional area sensors 104 is n rows×m columns, all the image pick-up outputs are as follows:

DAT (1, 1), DAT (2, 1), . . . DAT (m, 1)

. . .

DAT (1, n), DAT (2, n), . . . DAT (m, n)

Subsequently, the line noise detection unit 111 detects an existence of a line noise in the image pick-up outputs of the two-dimensional area sensor 104 stored in the memory circuit 110 (S2). It begins with a calculation of a sum of output values at each row as follows:

$$\Delta(DAT(1,n)+ \ldots +DAT(m,n))=SUMrow n$$

Namely, a sum of output values at all rows:

SUMrow1, SUMrow2, ... SUMrown is calculated.

Subsequently, sums of output values at rows on both sides of row x are compared with each other. In other words, the sums of output values at respective lines are compared with each other as follows:

$$\Delta SUMrow(x-1,x)=|SUMrow(x-1)-SUMrow(x)|>A$$

$$\Delta SUMrow(x,x+1)=|SUMrow(x)-SUMrow(x+1)|>A$$

where the value A is appropriately determined according to the image pick-up outputs of the two-dimensional area sensor 104 stored in the memory circuit 110. As a result, if the following is satisfied:

$$(\Delta SUMrow(x-1,x)=|SUMrow(x-1)-SUMrow(x)|>A) \cap (\Delta SUMrow(x,x+1)=|SUMrow(x)-SUMrow(x+1)|>A),$$

in other words, if both of output differences between the row x and the row x−1 and between the row x and the row x+1 are greater than the reference value A as a result of the comparison, a line noise is determined to exist in the X row.

Subsequently, a quantity of the line noise superposed in the X row is calculated (S3). In other words, by dividing the sum of output values at lines on both sides of the X row by 2, a sum of expected values of the X row (an average value) is calculated as follows:

$$SUMSrow(x)=(SUMrow(x-1)+SUMrow(x+1))/2$$

Thereafter, by dividing it by the number of columns m of the area sensor, the following expected value at the X row (an average value of a single sensor output) is calculated:

$$Srow(x)=(SUMSrow(x))/m$$

In the above, by subtracting the expected value of the X row from the value calculated by dividing the sum of the image pick-up outputs at the X row by the number of columns m, the following output quantity of the line noise at the X row is calculated:

$$Nrow(x)=(SUMrow(x)/m)-Srow(x)$$

Then, the image pick-up outputs are corrected (S4). In other words, by subtracting the output quantity of the line noise at the X row only from the image pick-up output at the line including a line noise in the image pick-up outputs of the two-dimensional area sensor 104 stored in the memory circuit 110, the following corrected image pick-up outputs are obtained:

$$DAT(1 \text{ to } m,x)=DAT(1 \text{ to } m,x)-Nrow(x)$$

Therefore, it becomes possible to obtain image pick-up outputs from which a line noise was subtracted in the image pick-up outputs of the two-dimensional area sensor 104.

As described above, according to this embodiment, an image is taken first, line noise information is extracted from the taken image, and it is detected whether the image includes a line noise; if so, a quantity of the line noise is corrected, by which high-quality image information is achieved with extemporaneous extrinsic line noises subtracted from the information. In other words, it becomes possible to obtain a preferable image also in a photo studio having a high voltage source for use in a radiation source.

Figure 3:
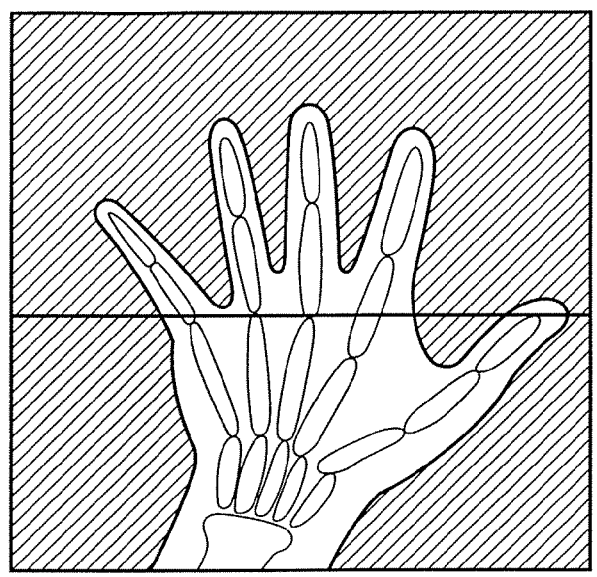
FIG. 3 is a diagram showing an example of an image taken by the imaging device according to the first embodiment.
Figure 4:
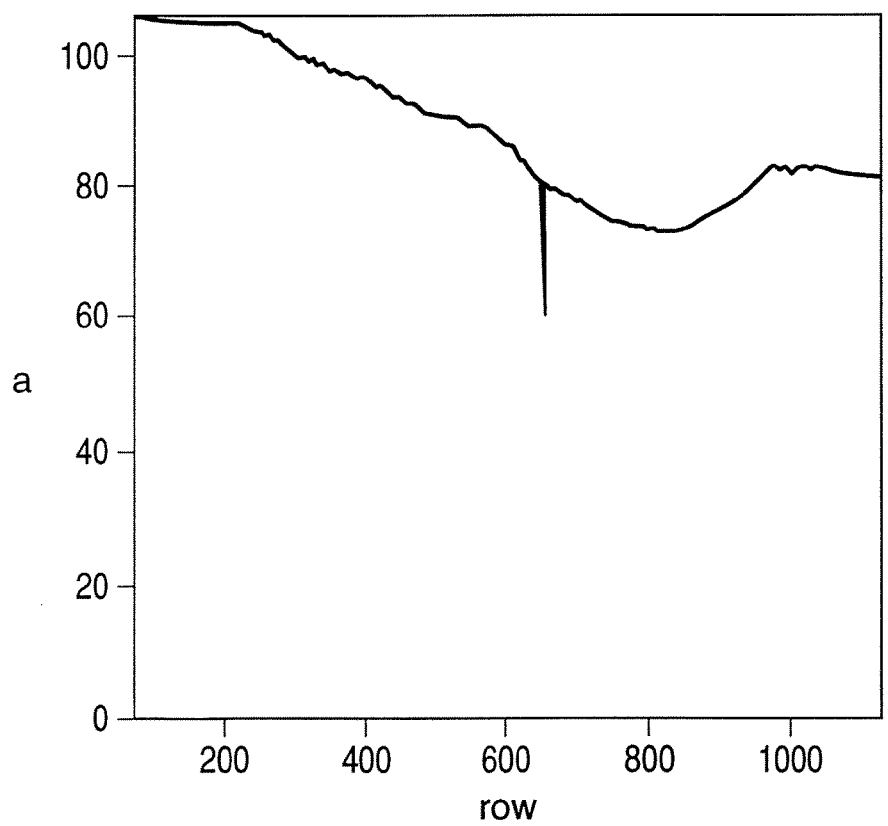
FIG. 4 is data of a sum of image pick-up outputs from all sensors in the longitudinal row direction according to the first embodiment.

Referring to FIG. 3, there is typically shown an example of an image taken by a radiation imaging device according to the first embodiment. From this image, an existence of a line noise is confirmed. In other words, a horizontal streak image in FIG. 3 shows a picture distortion caused by an extrinsic noise. In the sensor panel where this image was taken, a drive circuit for a switch element is horizontally arranged and a read IC including a sample hold circuit is vertically arranged. In other words, it is considered that the extrinsic noise occurred when electric charges are stored in a sample-hold capacitor and all the signal charges being stored are affected, which caused a line noise in a direction perpendicular to a signal line and in parallel to a driving line of the switch element. Referring to FIG. 4, there is shown data SUMrow obtained by summing up image pick-up outputs of all sensors in the column direction in this image. As is shown in FIG. 4, an existence of the line noise is confirmed around row 650.

Figure 5:
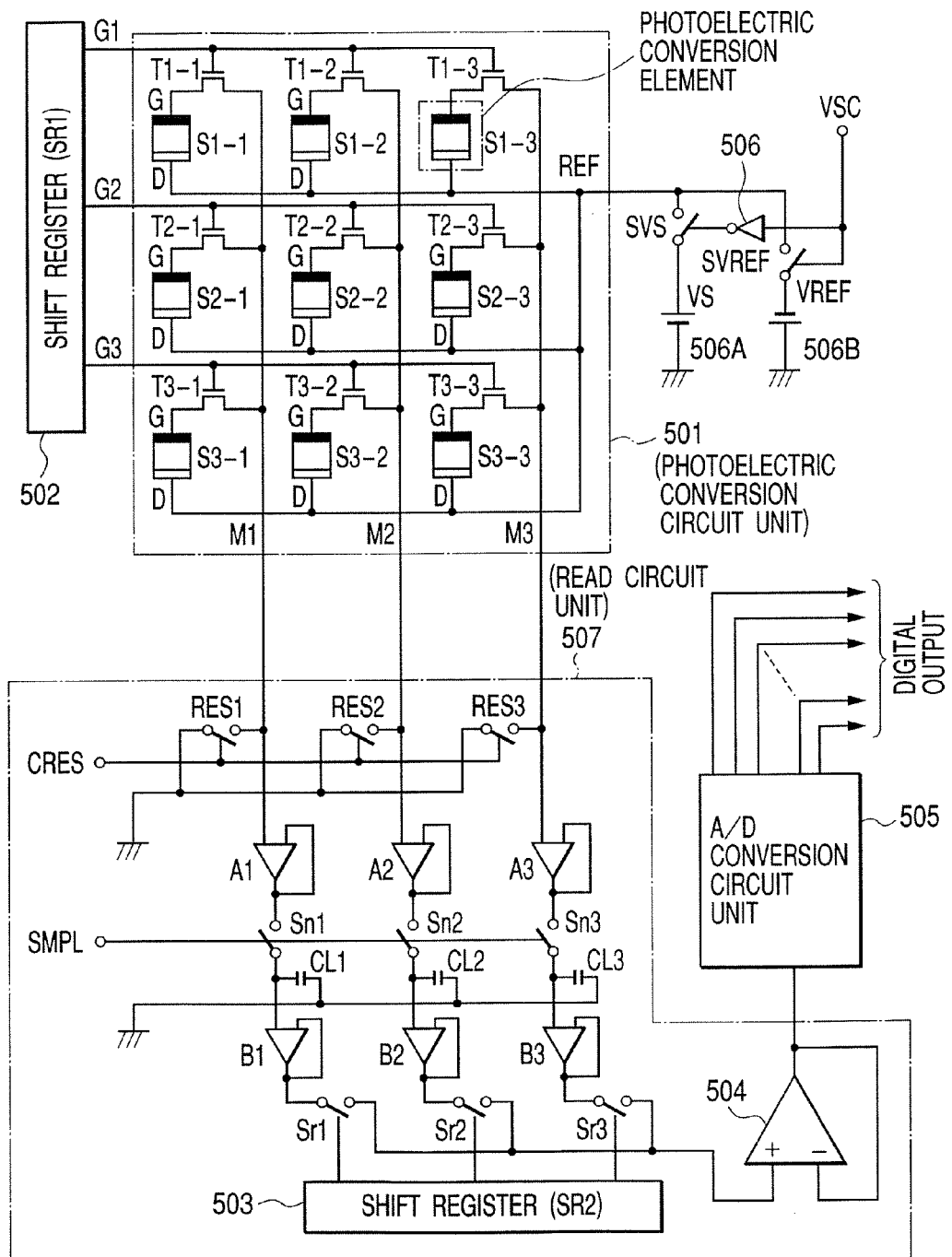
FIG. 5 is a general circuit diagram showing a configuration of a two-dimensional area sensor according to the first embodiment.
Figure 6A:
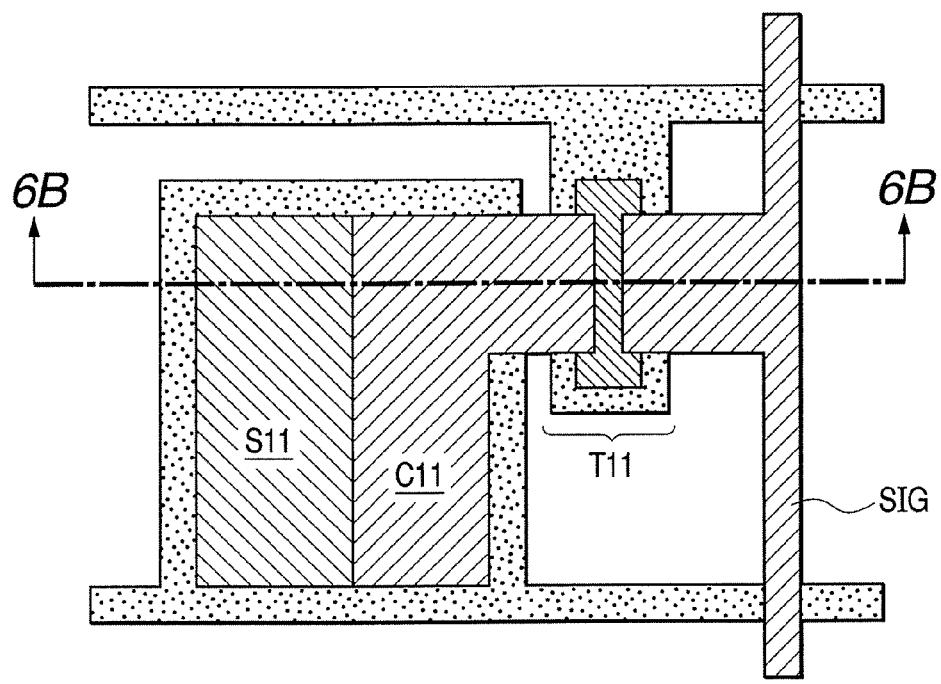
FIGS. 6A and 6B are a top plan view and a cross section respectively showing each element corresponding to a picture element in the two-dimensional area sensor according to the first embodiment.
Figure 6B:
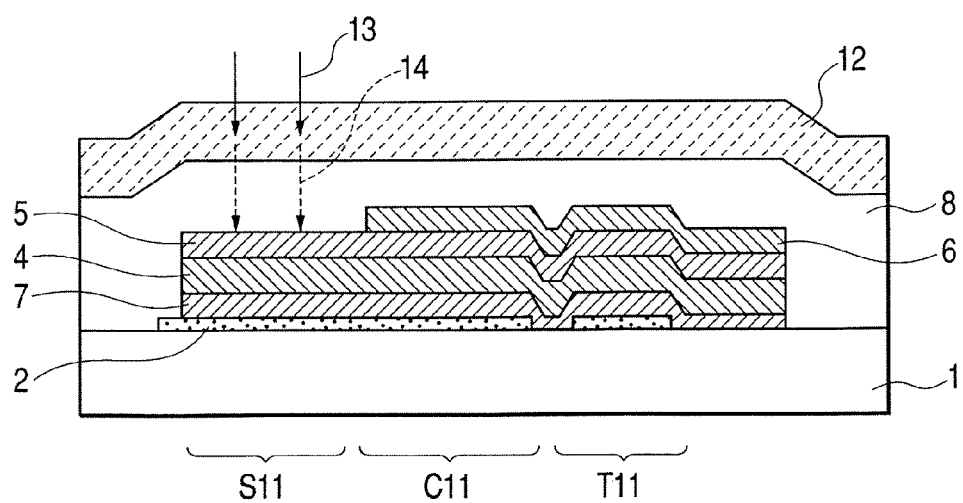

Referring to FIG. 5, there is shown an example of a general circuit diagram of a configuration of the two-dimensional area sensor 104. Referring to FIG. 6A, there is shown a top plan view of each element corresponding to a picture element in the two-dimensional area sensor 104, and FIG. 6B shows a cross section thereof.

In FIG. 5, there are shown photoelectric conversion elements S1-1 to S3-3 each having a G electrode and a D electrode for receiving visible light and converting it to an electrical signal and switch elements T1-1 to T3-3 for transferring signal charges photoelectrically converted by the photoelectric conversion elements to the side of matrix signal cables M1 to M3. Reference numerals G1 to G3 designate gate drive wires for switches connected to a shift register (SR1) and to the switch elements T1-1 to T3-3. A capacitor equal to three interelectrode capacitances (Cgs) of the switch elements is added to the matrix signal cable M1 at the transfer, and it is not noted as a capacitance element in FIG. 5. It is the same with other matrix signal cables M2 and M3.

A drive circuit unit 502 comprises a shift register (SR1) for opening or closing the switch elements T1-1 to T3-3. A read circuit 507 has operational amplifiers A1 to A3 and transfer switches Sn1 to Sn3 for reading outputs of the operational amplifiers A1 to A3 or outputs of the matrix signal cables M1 to M3 and for transferring them to readout capacitors CL1 to CL3. The readout capacitors perform the sampling and holding operation. An end of the sample-hold capacitor is connected to a reference potential, which is grounded here. If an extrinsic noise exists, it is considered that the extrinsic noise affects the reference potential and it causes a line noise.

A shift register (SR2) 503 is for use in switching read switches Sr1 to Sr3. Parallel signals CL1 to CL3 are converted to serial signals by the Sr1 to Sr3 and the shift register (SR2) 503, entered into the operational amplifier 504 forming a voltage follower circuit in the last stage, and digitized by an A/D conversion circuit unit 505. Reset switches RES1 to RES3 are for use in resetting signal components stored in the capacitor (three Cgs) added to the matrix signal cables M1 to M3 and they are reset to a certain reset potential (reset to the ground potential in the illustration) with a pulse from the CRES terminal.

Reference numerals 506A and 506B designate a power supply for supplying a bias to the photoelectric conversion elements S1-1 to S3-3 and a power supply for supplying a refresh bias to the photoelectric conversion elements, respectively. In the refresh operation, the switch element T is turned on and at the same time the RES is turned on, the G electrode of the photoelectric conversion element is fixed to a certain potential (the ground potential here), and a bias of the VREF 506B is applied to the photoelectric conversion elements for refreshing.

The two-dimensional area sensor of this embodiment has total nine picture elements divided into three blocks and transfers outputs of three picture elements per block in parallel simultaneously. They are sequentially converted to outputs by a detection integrated circuit through the signal wires before outputting. In addition, three picture elements in a block are horizontally arranged and three blocks are vertically arranged in order, by which the picture elements are arranged two-dimensionally.

Figure 14:
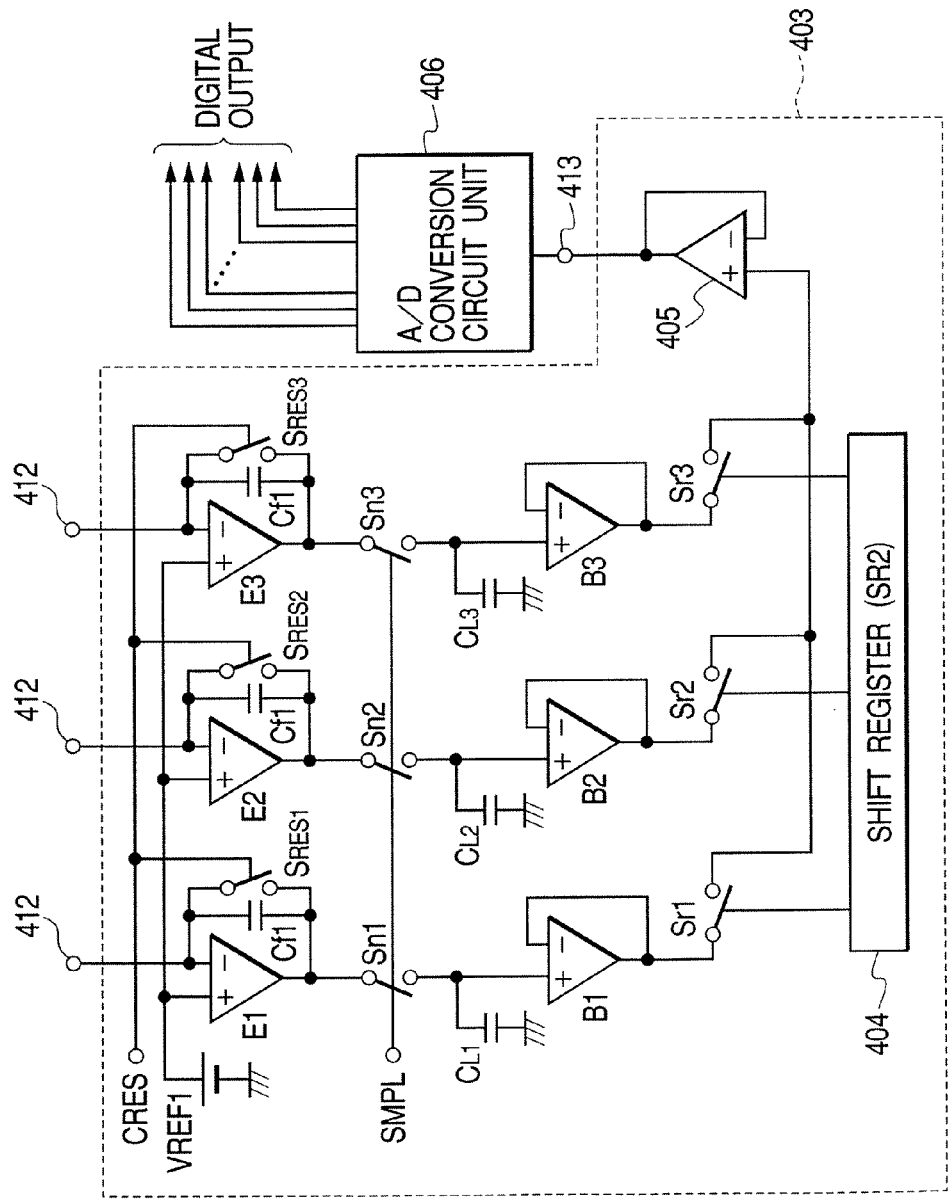
FIG. 14 is a view showing another example of the read circuit.

Another sample configuration of the read circuit is shown in FIG. 14. In FIG. 14, there are shown a plurality of terminals 412 connected to the matrix wires in FIG. 5, a read circuit unit 403 for converting parallel signals transferred via the terminals 412 to serial signals to output them, first operational amplifiers E1 to E3 in the first stage for the terminals 412 in a plurality of operational amplifiers connected to the terminals 412, first integral capacitors Cf1 connected between inverting input terminals and output terminals of the first operational amplifiers E1 to E3, first reset switches SRES1 to SRES3 of the first integral capacitors Cf1, a control signal CRES to be applied to the SRES1, SRES2, and SRES3, a first reference voltage VREF1 to which positive input terminals of the first operational amplifiers E1 to E3 are set, sampling switches Sn1 to Sn3 for sampling output signals output through the first operational amplifiers E1 to E3, a voltage pulse SMPL to be applied to the sampling switches Sn1 to Sn3, sampling capacitors CL1 to CL3, buffer amplifiers B1 to B3 for impedance conversion of signal charges stored in the sampling capacitors CL1 to CL3, read switches Sr1 to Sr3 for sequentially reading outputs of the buffer amplifiers B1 to B3 as serial signals, a switch drive circuit unit for readout (shift register SR2) 404, an output buffer amplifier 405, and a terminal 413 for connecting an output signal output from the output buffer amplifier 405 to another circuit as usage.

A reference numeral 406 designates an A/D conversion circuit unit. While an output signal from the read circuit unit 403 is connected to the A/D conversion circuit unit in this embodiment, it is not limited to this. For example, the A/D conversion circuit unit 406 can be included in the read circuit unit 403 and be connected to a processing circuit such as, for example, a memory or the like via the terminal 413. In addition, operational amplifiers can be arranged between the E and B amplifiers in a multistage form.

In the example shown in FIG. 14, one terminal of the sample hold capacitor CL is at the reference potential (the ground potential here), which is likely to cause a line noise due to an effect on the reference potential in case of an occurrence of an extemporaneous extrinsic noise.

The following describes a concrete configuration of the sensor panel. Portions enclosed by a dashed line in FIG. 5 are formed on the same insulating substrate having a large area. Among them, a portion corresponding to the first picture element is shown in FIG. 6A by means of a top plan view. In the illustration, there are shown a photoelectric conversion element S11, a TFT T11, and a signal wire (matrix wiring) SIG. In this embodiment, a capacitor C11 is formed by increasing an area of an electrode of the photoelectric conversion element S11.

It is possible since the photoelectric conversion element and the capacitor in this embodiment have the same laminated constitution, which characterizes this embodiment. Furthermore, a cross-sectional view taken on line 6B-6B of FIG. 6A is shown in FIG. 6B. At the top of the picture element, there is formed a phosphor 12 such as a silicon nitride film for passivation SiN8, CsI, $Gd_2O_2$ or the like. If an X-ray 13 including image information is incident on the phosphor 12 from upside above the paper, the phosphor 12 converts it to a beam 14 having the image information and the beam is incident on the photoelectric conversion element. The phosphor 12 corresponds to the phosphor 103 in FIG. 1.

Now the following sequentially describes a method of forming each picture element with referring to FIGS. 6A and 6B. First, Cr is deposited by approx. 50 nm as a lower metal layer 2 on a glass substrate 1 made of an insulating material by means of sputtering or the like. Thereafter, it is patterned by means of photolithography and unnecessary areas are etched out. This forms a lower electrode of the photoelectric conversion element S11, a gate electrode of the TFT T11, and a lower electrode of the capacitor C11.

Subsequently, the SiN(7)/i(4)/n(5) layer is deposited by approx. 20/500/50 nm in the same vacuum in the CVD method. These layers become an insulating layer, a photoelectric conversion semiconductor layer, and a hole injection preventive layer of the photoelectric conversion element S11, a gate insulating film, a semiconductor layer, and an ohmic contact layer of the TFT T11, and a middle layer of the capacitor C11. They are also used as a cross portion insulating layer of the signal wiring. The thickness of each layer is not limited to them, but is most appropriately designed according to a voltage, current, electric charges, an incident light intensity, or the like used for the two-dimensional area sensor. At least, however, SiN of 50 nm or more is required to prevent electrons and holes from passing through it and to function as a gate insulating film of the TFT.

After the layer deposition, Al is deposited as an upper metal layer 6 by approx. 1 µm by means of sputtering. Furthermore, it is patterned by means of photolithography and unnecessary areas are etched out to form an upper electrode of the photoelectric conversion element S11, a source electrode and a drain electrode to be the main electrodes of the TFT T11, an upper electrode of the capacitor C11, and a signal wire SIG.

In addition, an n layer is etched by using the reactive ion etching (RIE) technique only in the channel portion of the TFT T11 and then unnecessary SiN(7)/i(4)/n(5) layer is etched out to separate the elements from each other. This completes the photoelectric conversion element S11, the TFT T11, and the capacitor C11. The first picture element has been described hereinabove, and apparently other picture elements are formed simultaneously. In addition, to improve durability, the top of each element is generally covered with a passivation film 8 of SiN or the like and the phosphor 12 such as CsI, $Gd_2O_2S$, or the like is further formed on the film.

In this embodiment, the picture element can be formed only by the common lower metal layer 2 on which the photoelectric conversion element, the TFT, the capacitor, and the signal wire SIG are deposited simultaneously, the SiN(7)/i (4)/n(5) layer, and the upper metal layer 6 with etching of the layers. In addition, the injection preventive layer exists only at a single place in the photoelectric conversion element S11 and the layers can be formed in the same vacuum. Furthermore, a gate insulating film and an i-layer interface, which are important on the TFT characteristics, can be formed in the same vacuum. In addition, the middle layer of the capacitor C11 includes an insulating layer unlikely to have a leakage caused by heat, thereby achieving a capacitor having favorable characteristics.

Figure 7:
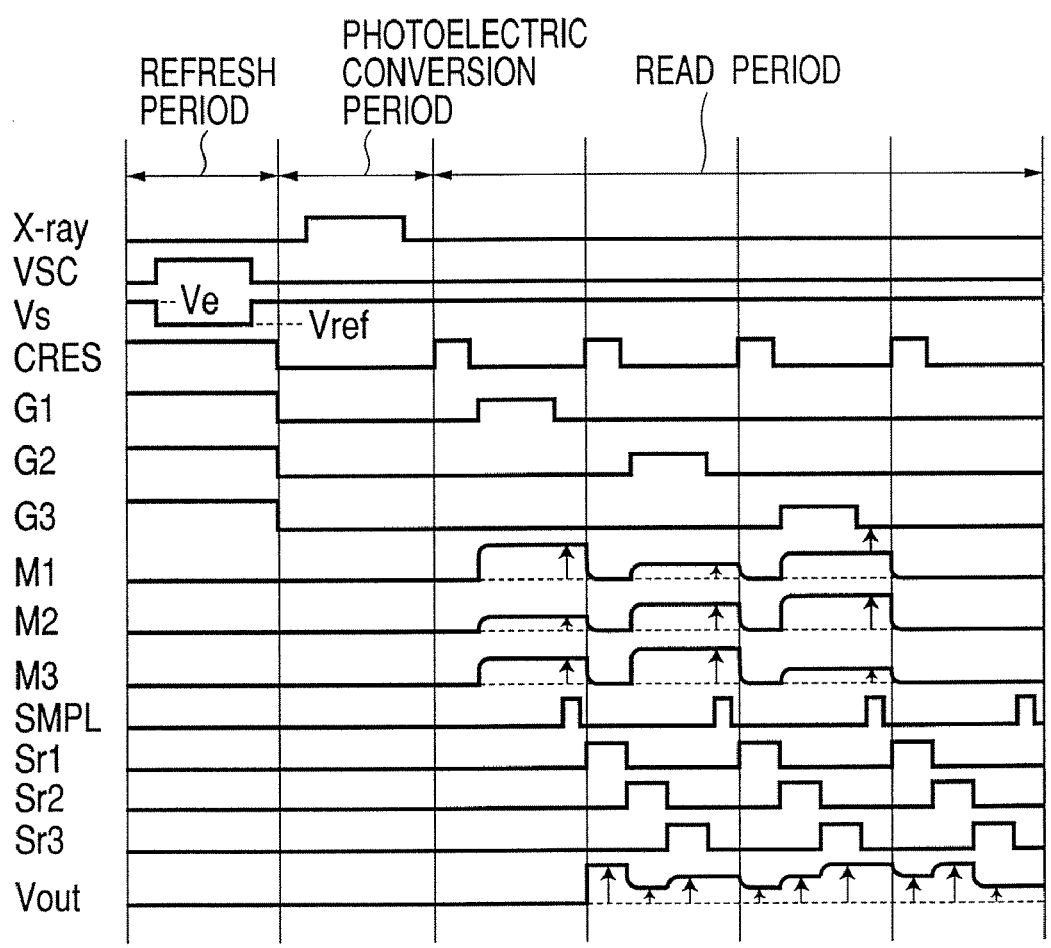
FIG. 7 is a timing chart showing an operation according to the first embodiment.

The following describes an operation of a radiation imaging device of this embodiment with referring to FIGS. 1, 5, and 7. The photoelectric conversion element is configured to perform refresh driving periodically. In the photoelectric conversion mode, it operates as an optical sensor outputting photocurrent proportional to an incident beam. Referring to FIG. 7, there is shown a timing chart illustrating the operation of this embodiment.

First, a doctor or an engineer locates a patient to have a checkup or an object 101 between the X-ray source 102 and the two-dimensional area sensor 104 and postures the object for observing a site to be checked up. At the same time, the doctor or the engineer enters conditions into a control panel (not shown) so as to obtain optimum image pick-up outputs taking into consideration of patient's symptoms, body build, age, and other required information previously obtained by a diagnostic process with an interview or the like. This signal is electrically transmitted to the control circuit 107 with an electrical signal. Simultaneously these conditions are stored in a condition memory circuit (not shown).

When the doctor or the engineer depresses the image pick-up switch 105 in this condition, the imaging mode is started. First, the control circuit 107 causes the two-dimensional area sensor 104 to perform the refresh operation as described above.

Thereafter, all the photoelectric conversion elements S11 to S33 enter the photoelectric conversion mode. In the photoelectric conversion mode, the signal charges obtained by photoelectric conversion in the photoelectric conversion elements S1-1 to S3-3 are accumulated in the capacitance components formed in the photoelectric conversion elements only during a selected period. The signal charges having been accumulated in the photoelectric conversion elements S1-1 to S1-3 in the first row are transferred to the capacitance components (the capacitances of three Cgs's of the switching elements T1-1 to T3-3) formed in the respective matrix signal wires M1 to M3 while the gate pulse signal G1 of the shift register (SR1) 102 keeps the switching elements T1-1 to T1-3 "ON" only during a period of time t1. In FIG. 4 M1 to M3 indicate states of the transfer and show a case of different signal quantities stored in the respective photoelectric conversion elements. The signal outputs on the matrix signal wires M1 to M3 are subjected to impedance transformation by the respective OP amps A1 to A3.

After that, the switching elements Sn1 to Sn3 in the reading circuit section are turned "ON" only during a period by the SMPL pulse shown in FIG. 7 to transfer the signals. The signals are subjected to impedance transformation by the respective buffer amplifiers B1 to B3. After that, the reading switches Sr1 to Sr3 are successively turned "ON" by shift pulses Sp1 to Sp3 from the shift register (SR2) 103, whereby the parallel signal charges having been transferred to the reading capacitors CL1 to CL3 are converted to serial signals to be read out. Supposing pulse widths of the shift pulses of Sp1, Sp2, Sp3. The serially converted signals are output from the final-stage OP amp 104 to be further digitized by the A/D conversion circuit section 105.

Vout shown in FIG. 7 indicates an analog signal before input to the A/D conversion circuit section. As shown in FIG. 7, the parallel signals of S1-1 to S1-3 in the first row, that is, the parallel signals of signal potentials on the matrix signal wires M1 to M3 are serially converted on the Vout signal in proportion to magnitudes of those signals. Finally, the signal potentials of the matrix signal wires M1 to M3 are reset to the predetermined reset potential (the GND potential) through the reset switch elements RES1 to RES3 by turning the CRES pulse "ON," thereby getting ready for next transfer of signal charges in the second row of the photoelectric conversion elements S2-1 to S2-3. After that, photoelectrically converted signals of the second row and the third row are repetitively read out in the same manner.

These outputs are stored in the memory circuit 110, which is an image pick-up output storage unit. Thereafter, as described with referring to FIGS. 1 and 2, the line noise detection unit 111 detects whether a line noise exists in the image pick-up outputs of the two-dimensional area sensor 104 stored in the memory circuit 110. If the line noise is confirmed in the image pick-up outputs of the two-dimensional area sensor 104 stored in the memory circuit 110, the arithmetic processing circuit 112 calculates the quantity of the line noise.

Finally, the output quantity of the line noise at the X row is subtracted only from the image pick-up outputs of the line where a line noise exists in the image pick-up outputs of the two-dimensional area sensor 104 stored in the memory circuit 110, by which corrected image pick-up outputs are achieved. In other words, it becomes possible to obtain image pick-up outputs from which the line noise is subtracted in the image pick-up outputs of the two-dimensional area sensor 104.

As set forth hereinabove, according to this embodiment, an image is taken first, line noise information is extracted from the taken image, and it is detected whether the image includes a line noise. If so, the quantity of the line noise at the line is corrected, thereby achieving high-quality image information from which the line noise is subtracted.

In addition, portability is improved by using a cassette structure in which at least one of the correction circuit 113 and the control circuit 107 in FIG. 1 is contained in the cabinet which includes the two-dimensional area sensor 104 and the phosphor 103, and therefore its use is preferable.

Second Embodiment

The following describes a second embodiment of the present invention. The second embodiment is not an imaging device with a phosphor and a two-dimensional area sensor as an imaging unit, but a radiation imaging device with an imaging unit directly detecting an X-ray and generating an electric charge. This embodiment is described by giving an example of a radiation imaging device for a medical X-ray diagnosis, too.

Figure 8:
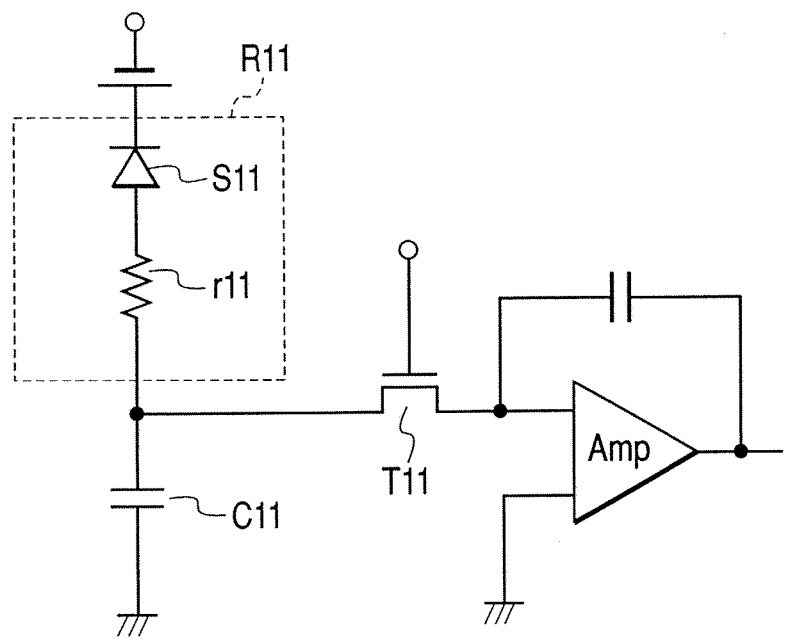
FIG. 8 is a diagram of an equivalent circuit of a picture element used in a second embodiment according to the present invention.

Referring to FIG. 8, there is shown an equivalent circuit diagram of a picture element for use in a direct radiation imaging device. In FIG. 8, there are shown a GaAs sensor element S11 for converting radiation to an electric signal and a storage capacitor C11 as an element for storing the electric signal sensed by the sensor element. Furthermore, a transistor T11 is an element for transferring the electric signal from the storage capacitor C11 to an amplifier (Amp) for amplifying.

A GaAs substrate forming the sensor element and a glass substrate forming the storage capacitor C11 and the transfer transistor T11 are bonded by conductive adhesive agent. Therefore, there is a junction resistance r11 between the GaAs substrate and the glass substrate. A sensor unit R11 including the sensor element S11 and the junction resistance r11 is indicated by a dashed line in FIG. 8.

Figure 9:
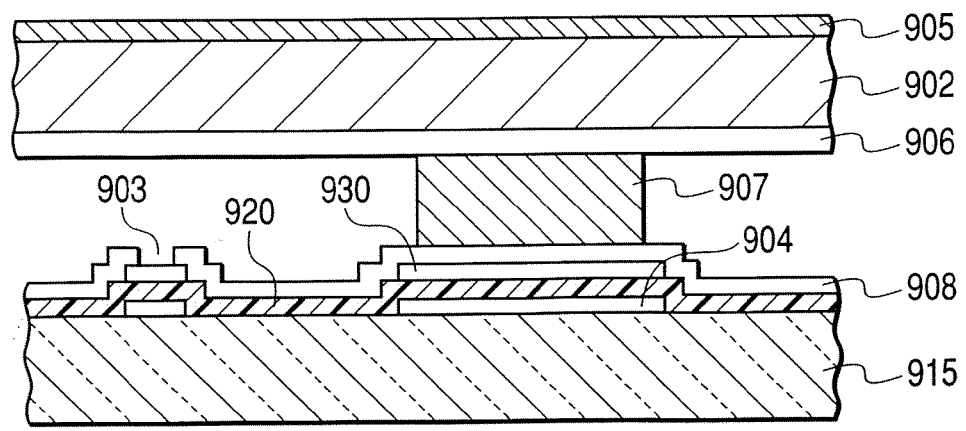
FIG. 9 is a cross section of a picture element according to the second embodiment.

Referring to FIG. 9, there is shown a typical cross sectional view of the picture element in FIG. 8. The elements described with referring to FIG. 8 are a sensor unit corresponding to the sensor unit R11 including the sensor element S11 and the junction resistance r11, a storage capacitor corresponding to the storage capacitor C11, and a transistor 903 corresponding to the transfer transistor T11.

In addition, there are shown a common electrode 905 of a GaAs substrate 902, an electron capturing electrode 906 for capturing electric signals converted by the GaAs sensor element, a conductive adhesive agent 907 for electrically connecting the GaAs substrate 902 to a glass substrate 915, and a junction electrode 908 connected to a transistor 903 for controlling a readout operation of an electric signal from the storage capacitor.

Furthermore, the laminated constitution having the storage capacitor and the transistor 903 formed on the glass substrate 915 comprises the first metal layer 904, an insulating layer 920 deposited thereon, and an intrinsic semiconductor layer 930 further deposited on it.

Figure 10:
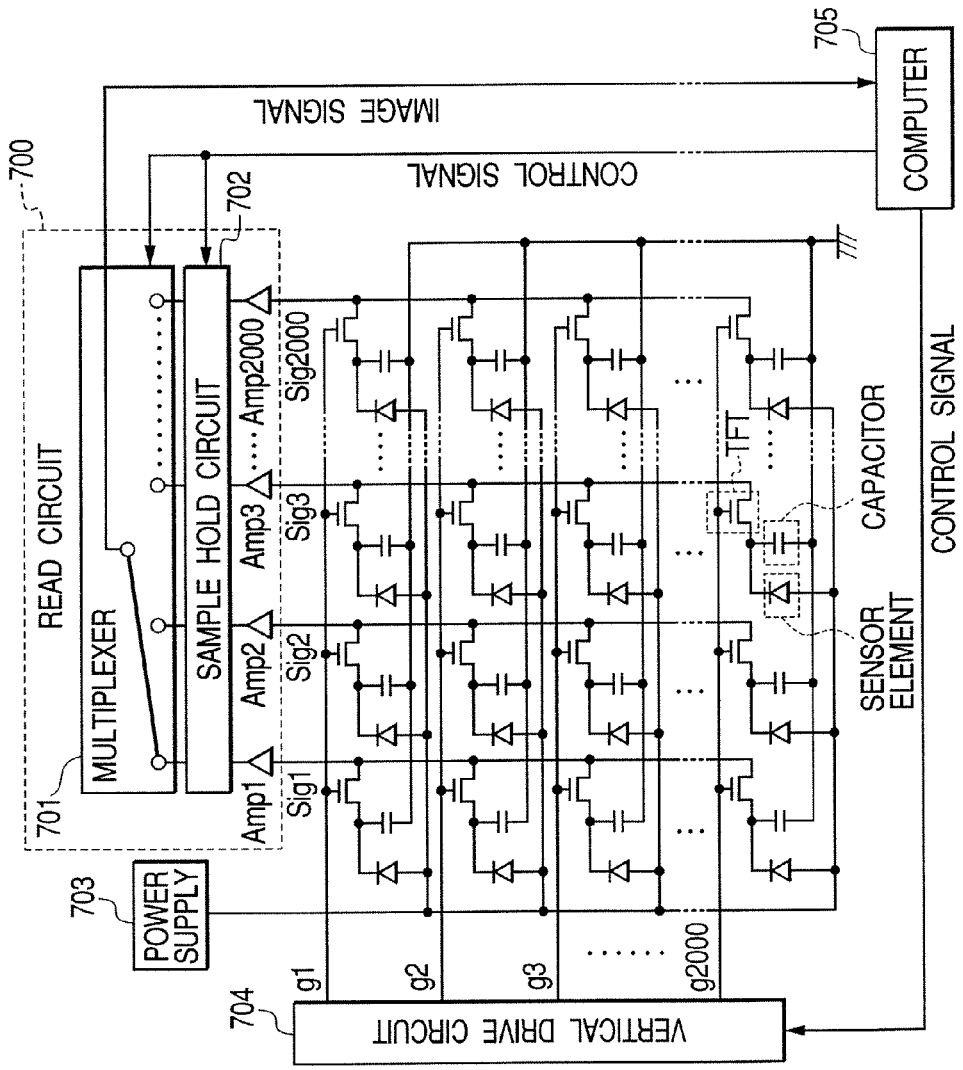
FIG. 10 is a diagram of an equivalent circuit showing a two-dimensional area sensor according to the second embodiment.

Referring to FIG. 10, there is shown a schematic diagram of a sample two-dimensional area sensor using the picture element in FIG. 9. The two-dimensional area sensor has 2,000×2,000 picture elements, 2,000×2,000 sensor elements, 2,000×2,000 transfer circuits (thin film transistor: TFT), and 2,000 capacitors. The sensor element, the TFT, and the capacitor correspond to the sensor unit R11, the transistor T11, and the storage capacitor C11 shown in FIG. 8, respectively. These elements form the two-dimensional area sensor. Amp in FIG. 10 corresponds to the Amp in FIG. 8.

The two-dimensional area sensor further comprises a vertical drive circuit 704 for driving the TFT, a read circuit 700 for reading a signal output from the TFT, a power supply 703, and a computer 705 for controlling the X-ray two-dimensional area sensor and controlling the two-dimensional area sensor in receiving a signal output from the two-dimensional area sensor, displaying and storing it as a two-dimensional original image, and correcting the image. The read circuit 700 includes a sample hold circuit 702 for sampling and holding a signal of the sensor unit and amplifiers.

To obtain a two-dimensional X-ray image, a voltage of +15V is applied to a gate wire g, the TFT connected to the gate wire is turned on, and electrical signals stored from the sensor element to the capacitor are transferred to the sample hold circuit 702 of the read circuit 700 via signal transfer lines (Sig1 to Sig2000). In the signal transfer, the TFT is put in the ON state for a certain period of time before a voltage of −5V is applied to the gate wire and the TFT is turned off to terminate the signal transfer.

Furthermore, the signals are sequentially transferred from the sample hold circuit 702 by a multiplexer (not shown). By repeating this operation sequentially, an X-ray two-dimensional image can be obtained. In this example, the capacitor for storing electric signals is MIS-typed and a certain potential electrode is grounded. Therefore, it is always used in a depression condition.

In this embodiment, the constitution in FIG. 10 corresponds to the two-dimensional area sensor 104 in FIG. 1 in the first embodiment. In addition, the computer 705 in FIG. 10 corresponds to the control circuit 107 in FIG. 1. Therefore, while the two-dimensional area sensor with the direct radiation detection element has been described with referring to FIG. 10 as described above, the configuration in FIG. 10 is used instead of the two-dimensional area sensor 104 in FIG. 1 and other configurations are the same as those in FIG. 1 as the entire configuration of the second embodiment. Note that, however, the phosphor 103 in FIG. 1 is unnecessary since the direct radiation detection element is used.

In addition, a line noise is detected and corrected in the second embodiment exactly as with the first embodiment. In this manner, it is also possible to obtain a high-quality image from which the line noise is subtracted in the direct radiation imaging device.

Third Embodiment

Figure 11:
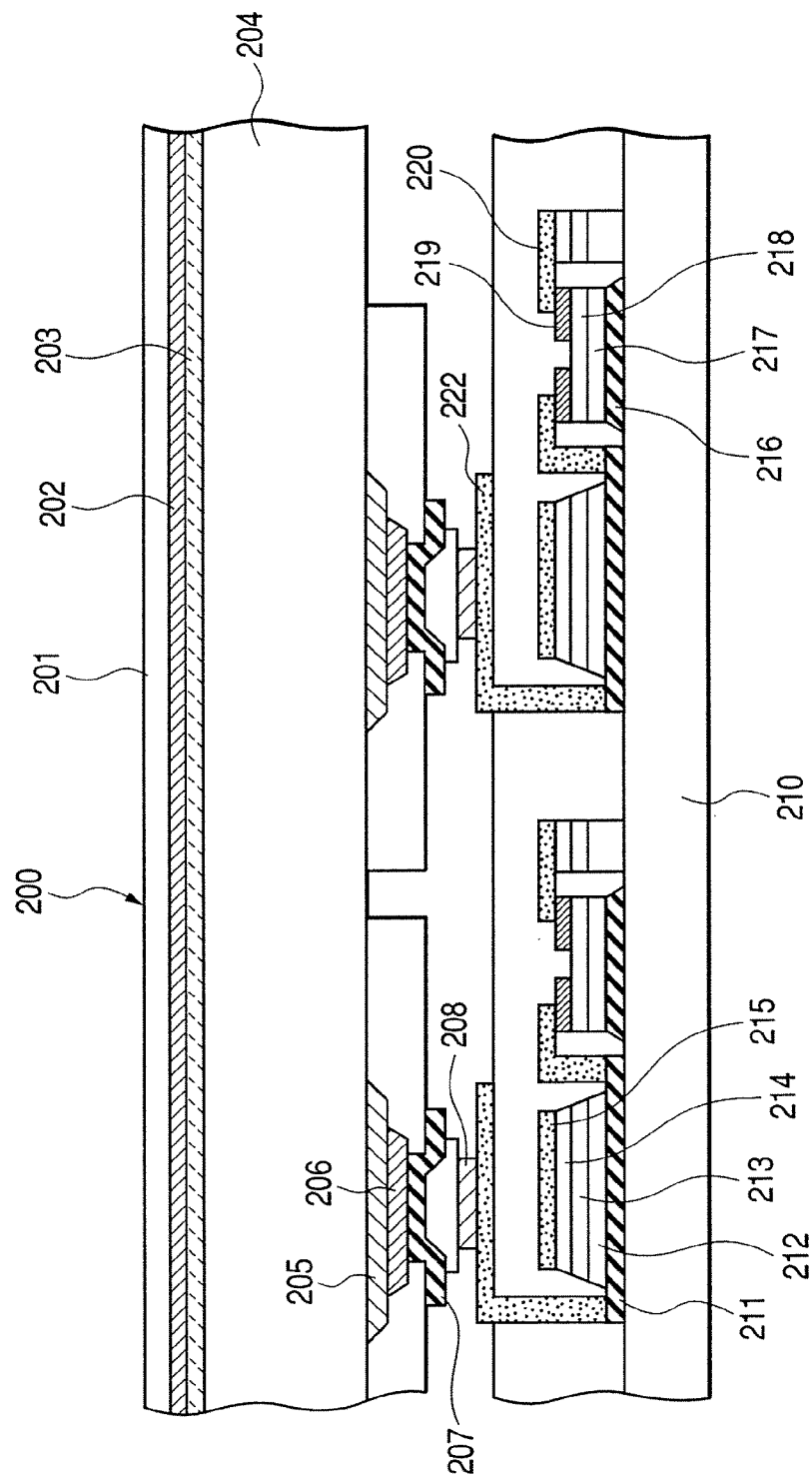
FIG. 11 is a cross section of a picture element used in a third embodiment according to the present invention.

Referring to FIG. 11, there is shown a diagram of still another embodiment of a direct radiation imaging device. FIG. 11 is a cross-sectional view of two picture elements of the direct radiation imaging device, showing a laminated constitution including a sensor element, a storage capacitor, and a TFT. While the sensor element in FIG. 11 can be made of silicon (Si), gallium arsenide (GaAs), gallium phosphide (GaP), or other semiconductor, GaAs is used here for the description.

The sensor element is a PIN diode with a GaAs wafer, comprising a protective layer 200 as a top layer, first, an upper electrode layer 201 formed by a metal material such as aluminum (Al), a $p^+$-type GaAs layer 203 for taking an ohmic contact between the GaAs substrate and the upper substrate, a photoelectric conversion layer 204 for generating carriers with a photoelectric effect, an n-type GaAs layer 205, $n^+$-type GaAs layer 206 for taking an ohmic contact with a lower connection electrode, and a lower connection electrode 207 formed by a metal such as aluminum.

First, the n-type GaAs layer and the $n^+$-type GaAs layer are sequentially deposited by 300 nm and 100 nm, respectively, on the semi-insulating GaAs substrate or a low-doped p-type GaAs substrate in the molecular beam epitaxy (MBE) method or the liquid phase epitaxy (LPE) method. Thereafter, patterning is made by means of lithography and then the layers are etched in shapes corresponding to the electrodes. Furthermore, a silicon nitride film (SiNx) is deposited by 1 μm in the chemical vapor deposition (CVD) method to protect the surface.

Subsequently, the p-type GaAs layer is deposited by 300 nm in the MBE or LPE method and an aluminum or other metal layer is deposited by 1 μm by means of sputtering on the other side of the substrate sequentially. The silicon nitride film on the side of the n-type GaAs layer deposited is opened by means of etching and an aluminum or other metal layer to be the lower connection electrode is deposited by 1 μm by means of sputtering or the like. Furthermore, patterning is made by means of lithography and unnecessary portions are etched out to form the electrodes.

The lower electrical circuit substrate includes a substrate 210 which is insulative at least on its surface, a thin film transistor (TFT) as a storage capacitor and a switching element and wiring for transferring signals formed on the substrate 210. The laminated constitution comprises a lower electrode 211 for a storage capacitor made of chromium (Cr) on the insulating substrate, a gate electrode 216 of the TFT, an amorphous silicon nitride (a-SiNx) layer 212 or 217 as an insulating layer, a hydrogenated amorphous silicon (a-Si:H) layer 213 or 218 to be a channel layer of the TFT or to be a dielectric layer of the storage capacitor, an $n^+$-type a-Si:H layer 214 or 219 for taking an ohmic contact with the upper electrode, an electrode layer 215 or 220 made of Al or other metal to be the upper electrode of the storage capacitor, the source electrode of the TFT, and the drain electrode thereof, an a-SiNx layer 221 to be the protective layer, and an upper connection electrode layer 222 for a connection with a photoelectric conversion layer. The upper connection electrode layer is connected to the lower electrode of the storage capacitor via a contact hole.

In addition, Cr or other metal is formed by 100 nm on a substrate which is insulative at least on its surface by means of sputtering, patterning is made by means of lithography, and then unnecessary portion is etched out to separate the lower electrode of the storage capacitor from the gate electrode of the TFT. Subsequently, an a-SiNx layer of 300 nm, an a-Si:H layer of 300 nm, and an n-type a-Si:H layer of 750 nm to be insulating layers are deposited sequentially in the CVD method. Patterning is made by means of lithography, the layer is etched by using the reactive ion etching (RIE) technique to separate the storage capacitor from the TFT, and further a contact hole is formed by RIE for connecting the TFT to the storage capacitor.

Furthermore, Al is deposited by 1 μm by means of sputtering, patterning is made by means of lithography, and the layer is etched to be divided into a source electrode of the TFT, a drain electrode thereof, an upper electrode of the storage capacitor, and signal transfer wiring. In addition, a-SiNx to be a protective layer is deposited in the CVD method and a contact hole is formed by RIE for connecting the lower electrode to the upper connection electrode. Furthermore, an Al or other metal layer to be the upper connection electrode is formed by means of sputtering, patterning is made by means of lithography, and then unnecessary portions are etched out by using the RIE technique to form the upper connection electrode layer.

While FIG. 11 shows only two picture elements, apparently a lot of picture elements necessary for the image pick-up are formed at a time practically. The thickness of each layer is not limited to the above, but an optimum film thickness is used.

In a method of connecting the sensor element to the TFT, the sensor element is formed on a bump 208 and then both are electrically connected with each other by using anisotropic conducting adhesive. Regarding the bump, barrier metal made of gold (Au) of 1 μm, palladium (Pd), and titanium (Ti) is formed and then an Au bump of 15 μm in height is formed.

Figure 12:
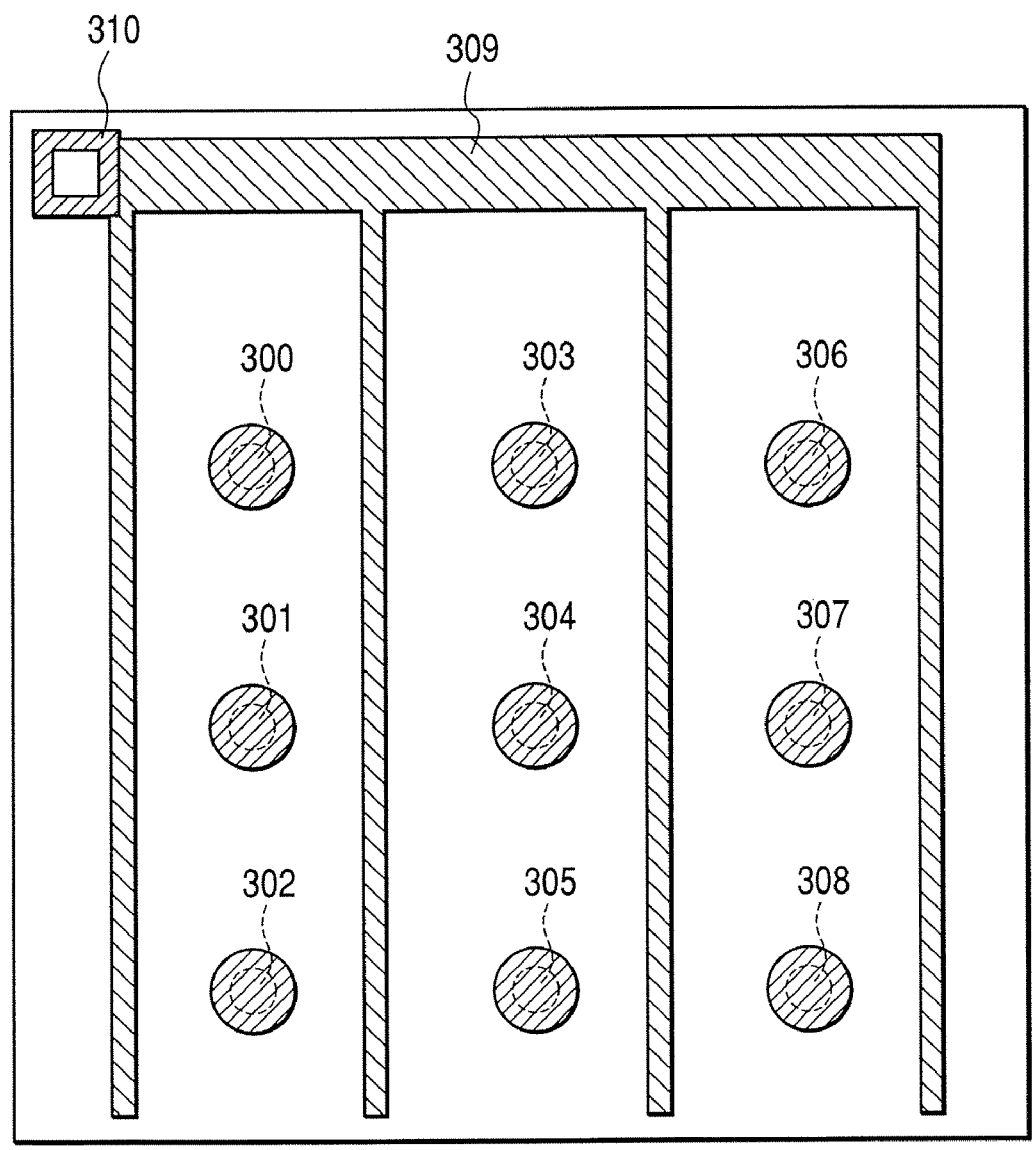
FIG. 12 is a view showing a frame format of a sensor element on a GaAs substrate in the third embodiment, viewed from the connection side.
Figure 13:
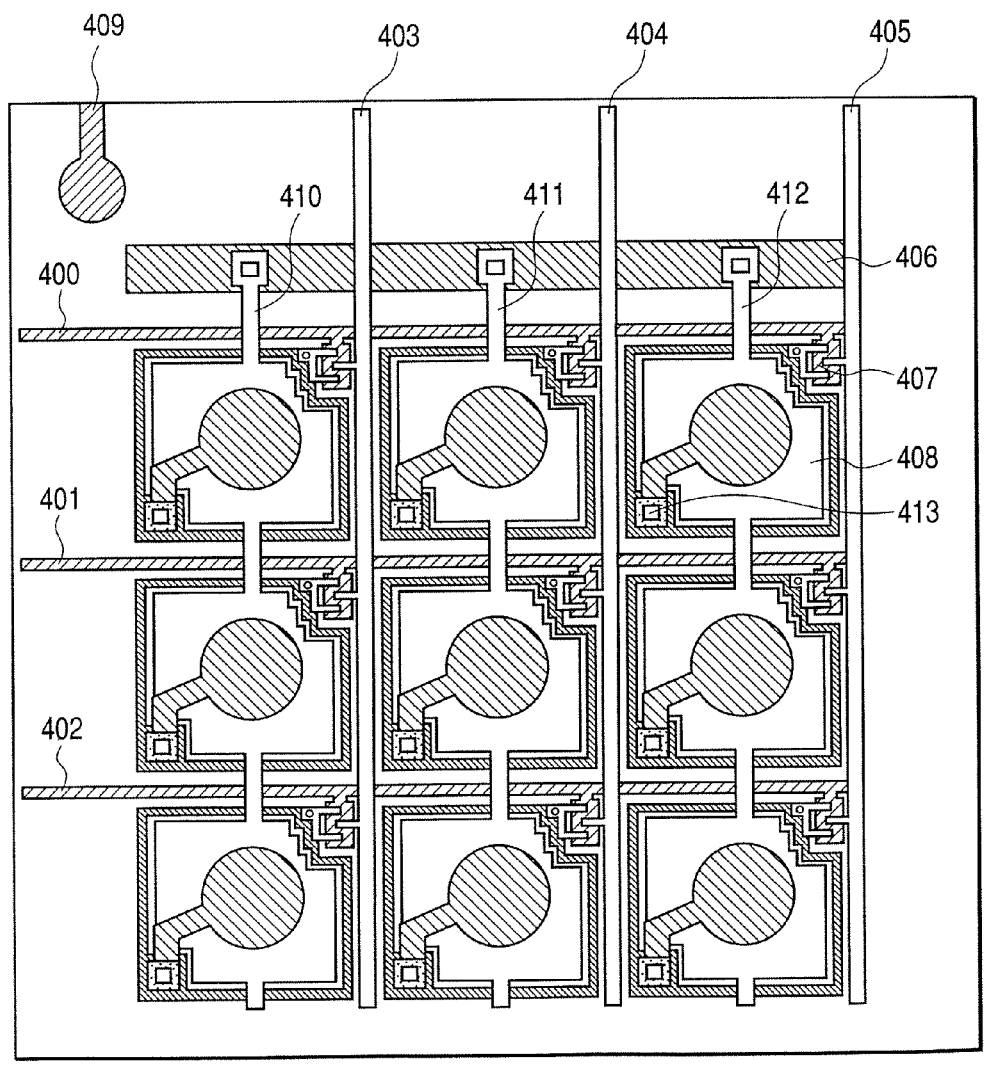
FIG. 13 is a view showing a frame format of the lower electrical circuit board in the third embodiment, viewed from the connection side.

Referring to FIG. 12 and FIG. 13, there are shown views of a frame format of a sensor element on the GaAs substrate and a frame format of the lower electrical circuit board, viewed from the connection side of the both, respectively. As shown in FIG. 12, carrier supplying electrodes of the sensor element are arranged in a striped shape and an identical potential is applied to all of them. A voltage is supplied from the TFT via a portion 310.

The lower electrical circuit board is connected to a TFT 407, a picture element formed by a storage capacitor 408, gate bias wires 400 to 402 for supplying a bias to the TFT gate electrode, signal transfer lines 403 to 405 for reading electrical signals output from the TFT and transferring them to the circuit, an electrode 406 connected to the upper electrode of the storage capacitor and fixing a potential, and the sensor element, the lower electrical circuit board comprising electrodes for supplying a voltage to the carrier supplying electrodes.

The electrode 406 and the gate electrodes 400 to 402 are formed by the same material as for the lower electrodes of the storage capacitor and the signal transfer lines are formed by the same material as for the upper electrodes of the storage capacitor. They are formed when the lower electrodes and the upper electrodes are formed, respectively.

While an example of 3×3 picture elements is given in FIG. 12 and FIG. 13, the actual number of picture elements is not limited to this. In addition, while a voltage is supplied from the TFT to the carrier supplying electrodes in the method described above, the present invention is not limited to this, but the sensor element can be directly connected to the power supply in one way or another.

While the two-dimensional area sensor with the direct radiation detection element has been described here with referring to FIGS. 11 to 13, it corresponds to the two-dimensional area sensor 104 of the first embodiment. Therefore, the entire configuration of the third embodiment is the same as the configuration in FIG. 1 except that the two-dimensional area sensor shown in FIGS. 11 to 13 is used instead of the two-dimensional area sensor 104 shown in FIG. 1. Note that, however, the phosphor 103 is unnecessary since the direct radiation detection element is used.

In addition, a line noise is detected and it is corrected in the third embodiment in the same manner as for the first and second embodiments. Therefore, a high-quality image is obtained with line noise subtracted therefrom also in the third embodiment.

What is claimed is:

1. An imaging device comprising:
   a plurality of picture elements arranged in a row direction and in a column direction for generating electric charges according to an amount of incident radiation, wherein each of the plurality of picture elements has a switch element for transferring the electric charge;
   a driving line for driving a plurality of the switch elements arranged in the row direction;
   a sample hold circuit for sampling and holding the electric charges transferred from the picture elements and outputted via a plurality of signal lines in parallel, and reading the electric charges sequentially;
   a memory circuit that stores image pick-up outputs of said picture elements;
   a noise detection unit that detects line noise caused in parallel to the driving line in the image pick-up outputs stored in said memory circuit, wherein said noise detection unit detects an existence of the line noise in a current row X based on a calculation result such that an absolute value of a difference between a total sum of output values from the picture elements in the current row X and a total sum of output values from the picture elements in a prior row X−1 is larger than a predetermined value, and such that an absolute value of the difference between the total sum of the output values from the picture elements in the current row X and a total sum of output values from the picture elements in a succeeding row X+1 is larger than a predetermined value;
   means for calculating an output quantity of the detected line noise, in response to a detection of the line noise; and
   means for correcting, in response to a detection of the line noise, the image pick-up output by subtracting the output quantity of the detected line noise calculated by the means for calculating from image pick-up controls from each of the rows in which the existence of the line noise is detected.

2. The device according to claim 1, wherein each of the plurality of picture elements further comprises a photoelectric conversion element or a direct radiation detection element.

3. The device according to claim 1, further comprising a drive circuit for applying a signal to the driving line for opening or closing the switch element.

4. The device according to claim 1, wherein with respect to the output quantity of the detected line noise for a current row X in which the existence of noise is detected, the output quantity is calculated by calculating an average of sums of the image pick-up outputs at rows adjacent on both sides of the current row X, by calculating a corrected value of the current row X by dividing the average value by the number of adjacent columns, and by subtracting the corrected value for the current row X from a value obtained by dividing a sum of the image pick-up outputs for the current X row by the number of columns so as to arrive at the output quantity.

5. An imaging system, comprising:
an imaging device according to claim 1;
emitting means for emitting light or radiation; and control means for controlling each of said means.

6. The system according to claim 5, wherein said emitting means comprises a radiation source and a phosphor so that an object can be put between said radiation source and said phosphor.

7. An imaging method for use in an imaging device, wherein the imaging device comprises:
- a plurality of picture elements arranged in a row direction and in a column direction for generating electric charge according to an amount of incident radiation, wherein each of the plurality of picture elements has a switch element for transferring the electric charge;
- driving line for driving a plurality of the switch elements arranged in the row direction;
- a sample hold circuit for sampling and holding electric charges transferred from the picture elements and outputted via a plurality of signal lines in parallel, and reading the electric charges sequentially; and
- a memory circuit that stores image pick-up outputs of the picture elements, wherein the method comprises:
detecting an existence of line noise caused in parallel to the driving line in the image pick-up outputs stored in the memory circuit, wherein the existence of the line noise is detected by detecting an existence of the line noise in a current row X based on a calculation result such that an absolute value of a difference between a total sum of output values from the picture elements in the current row X and a total sum of output values from the picture elements in a prior row X−1 is larger than a predetermined value, and such that an absolute value of the difference between the total sum of output values from the picture elements in the current row X and a total sum of the output values from the picture elements in a succeeding row X+1 is larger than a predetermined value;

calculating an output quantity of the of the detected line noise, in response to a detection of the line noise; and subtracting, in response to a detection of the line noise, the calculated output quantity of the detected line noise from image pick-up outputs from each of the rows in which the existence of the line noise is detected.

\* \* \* \* \*